United States Patent [19]

Kondoh et al.

[11] 4,259,432

[45] Mar. 31, 1981

[54] PHOTOPOLYMERIZABLE COMPOSITIONS HAVING COMBINED PHOTOINITIATORS

[75] Inventors: Syunichi Kondoh; Akihiro Matsufuji; Yuji Ohara; Akira Umehara, all of Asaka, Japan

[73] Assignee: Fuji Photo Film Co., Ltd., Minami-ashigara, Japan

[21] Appl. No.: 82,361

[22] Filed: Oct. 5, 1979

[30] Foreign Application Priority Data

Oct. 6, 1978 [JP] Japan ............................. 53-123317

[51] Int. Cl.$^3$ .............................................. G03C 1/68
[52] U.S. Cl. ............................. 430/281; 204/159.18; 204/159.23; 430/282; 430/283; 430/287; 430/288; 430/905; 430/916
[58] Field of Search ............... 430/281, 282, 283, 284, 430/285, 286, 287, 288, 916, 905; 204/159.18, 159.23

[56] References Cited

U.S. PATENT DOCUMENTS

| | | | |
|---|---|---|---|
| 3,954,475 | 5/1976 | Bonham et al. | 430/281 |
| 4,082,556 | 4/1978 | Hunter | 204/159.18 |
| 4,141,807 | 2/1979 | Via | 204/159.23 |
| 4,175,971 | 11/1979 | Shinozaki et al. | 204/159.18 |
| 4,189,366 | 2/1980 | Newland | 204/159.18 |

Primary Examiner—Jack P. Brammer
Attorney, Agent, or Firm—Sughrue, Rothwell, Mion, Zinn and Macpeak

[57] ABSTRACT

In a photopolymerizable composition comprising (1) an addition-polymerizable compound having at least one ethylenically unsaturated double bond and (2) a photopolymerization initiator as essential components, the improvement which comprises that said photopolymerization initiator is a combination of (a) p-dialkylamino aromatic carbonyl compounds represented by the general formulae (1) to (4), (b) 5-isoxazolones represented by the general formula (5) and (c) 2,4,6-substituted-1,3,5-triazines represented by the general formula (6):

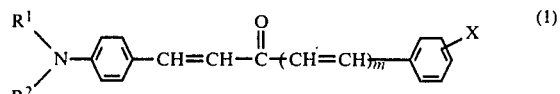
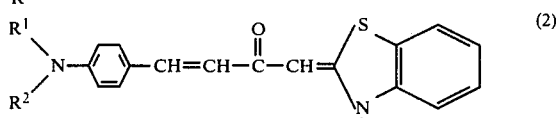
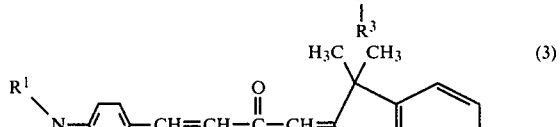
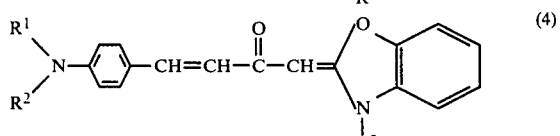
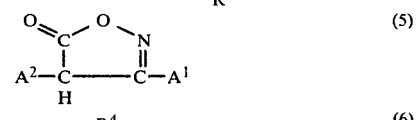
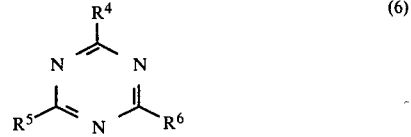

where $R^1$, $R^2$ and $R^3$ each represents an alkyl group or a substituted alkyl group, which may be the same or different from one another, X represents a substituent having a Hammett's $\sigma$ value in the range from $-0.9$ to $0.7$, m represents 1 or 2, $A^1$ and $A^2$ each represents an alkyl group, a substituted alkyl group, an alkylcarbonyl group, an alkoxycarbonyl group, an aryl group, a substituted aryl group, an arylcarbonyl group or a hydrogen atom, which may be the same or different from each other, and $R^4$, $R^5$ and $R^6$ each represents an alkyl group, a substituted alkyl group, an aryl group, a substituted aryl group or an aralkyl group, which may be the same or different from each other, but at least one of them represents a mono-, di- or trihalomethyl group.

10 Claims, No Drawings

PHOTOPOLYMERIZABLE COMPOSITIONS HAVING COMBINED PHOTOINITIATORS

BACKGROUND OF THE INVENTION

1. Field of the Invention

The present invention relates to photopolymerizable compositions and particularly to photopolymerizable compositions containing a photopolymerization initiator having a novel composition which are sensitive to, for example, argon laser rays.

2. Description of the Prior Art

Hitherto, it has been well known to form images by a process which comprises preparing a photopolymerizable composition comprising an addition-polymerizable compound having at least one ethylenically unsaturated double bond (hereinafter "ethylenic compound"), a photopolymerization initiator and, if necessary, an organic high molecular substance having film-forming ability, a thermal polymerization inhibitor or a plasticizer, etc., producing a solution of this photopolymerizable composition, applying the solution to a base to produce a photosensitive material providing with a photopolymerizable composition layer (photosensitive layer), exposing imagewise to light the photosensitive layer using a desired original, polymerizing the exposed area to harden it and treating with an organic solvent capable of dissolving the nonhardened area to remove the nonhardened area by dissolution, by which an image composed of the hardened area is formed. Alternatively, images have been formed by a process which comprises producing a laminate by pressing to adhere the above-described photosensitive material to another image supporting base (either the base of the photosensitive material or the image supporting base is transparent), exposing imagewise to light at the transparent base side, polymerizing the exposed area of the photosensitive layer to vary the adhesive strength of the photosensitive material to the base and that of the photosensitive material to the image supporting base such that the degree of adhesion is different between the exposed and unexposed areas and separating both bases, by which the photosensitive layer in the unexposed area transfers to one base and the photosensitive layer in the exposed area adheres to other base to form an image composed of the photosensitive layer respectively. In such processes, benzyl, benzoin, anthraquinone or Michler's ketone, etc., have been used as a photopolymerization initiator. However, the photopolymerizable compositions containing these photopolymerization initiators have a problem that they are hardly sensitive to ultraviolet rays of a long wavelength or visible rays such as argon laser, etc., and do not exhibit polymerization initiating ability, though they are sensitive to ultraviolet rays having a comparatively short wavelength. It is very desirable to use visible rays or a light source capable of scan exposure, for example, laser rays as a light source for exposure in image formation.

SUMMARY OF THE INVENTION

An object of the present invention is to overcome the above-described problems in conventional photopolymerizable compositions.

The present invention provides:

In photopolymerizable compositions comprising (1) an addition-polymerizable compound having at least one ethylenically unsaturated double bond and (2) a photopolymerization initiator as indispensable components, the improvement where said photopolymerization initiator is a combination of (a) p-dialkylamino aromatic carbonyl compounds represented by the general formulae (1) to (4), (b) 5-isoxazolones represented by the general formula (5) and (c) 2,4,6-substituted-1,3,5-triazines represented by the general formula (6):

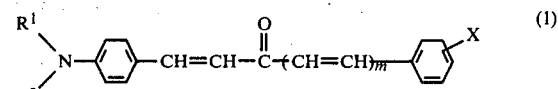

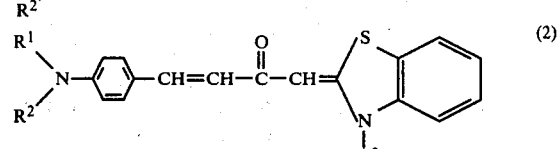

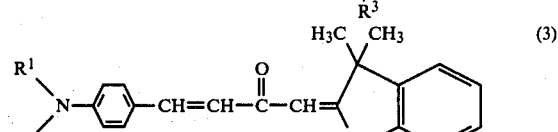

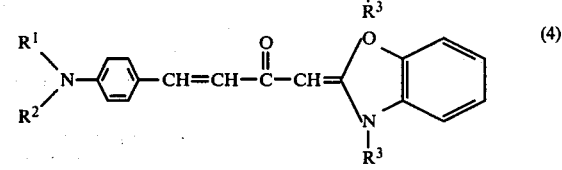

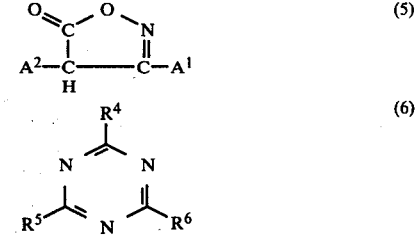

where $R^1$, $R^2$ and $R^3$ each represents an alkyl group or a substituted alkyl group, which may be the same or different from one another, X represents a substituent having a Hammett's $\sigma$ value in the range from $-0.9$ to $0.7$, m represents 1 or 2, $A^1$ and $A^2$ each represents an alkyl group, a substituted alkyl group, an alkylcarbonyl group, an alkoxycarbonyl group, an aryl group, a substituted aryl group, an arylcarbonyl group or a hydrogen atom and may be the same or different, and $R^4$, $R^5$ and $R^6$ each represents an alkyl group, a substituted alkyl group, an aryl group, a substituted aryl group or an aralkyl group and may be the same or different, but at least one of $R^4$, $R^5$ and $R^6$ represents a mono-, di- or trihalomethyl group; and photopolymerizable compositions which additionally comprise an organic high molecular substance having film-forming ability and compatible with components (1) and (2) as a binder.

DETAILED DESCRIPTION OF THE INVENTION

The addition-polymerizable compounds having at least one ethylenically unsaturated double bond (hereinafter ethylenic compound) in the photopolymerizable compositions of the present invention are compounds having at least one ethylenically unsaturated double bond in their chemical sturcture, which have a chemical form such as a monomer, a prepolymer such as a dimer, a trimer or another oligomer, an oligoester monomer or polyester monomer containing two or more ester bonds in the molecule, a mixture of them or a copolymer of them, etc. Examples include unsaturated carboxylic acids and salts thereof, esters thereof with aliphatic polyol compounds, oligoesters (or polyesters) having hydroxyl groups in the molecule or polyhydric phenols. The polyol compounds include oligomers and polymers such as oligoesters or polyesters of the above-described polyol compounds and dibasic acids, etc.

Examples of unsaturated carboxylic acids include acrylic acid, methacrylic acid, itaconic acid, crotonic acid, isocrotonic acid and maleic acid. As the salts of unsaturated carboxylic acids, there are sodium salts and potassium salts of the above-described acids.

As the above-described aliphatic polyol compounds and polyhydric phenols, there are dihydric alcohols such as ethylene glycol, triethylene glycol, tetraethylene glycol, tetramethylene glycol, neopentyl glycol, 1,10-decanediol, 1,2-butanediol, 1,3-butanediol, 1,3-propanediol or propylene glycol, etc., trihydric alcohols such as trimethylolethane or trimethylolpropane, etc., and polymers of them, pentaerythritol, dipentaerythritol, tripentaerythritol, other polypentaerythritols, sugars such as sorbitol or d-mannitol, etc., dihydroxycarboxylic acids such as dihydroxymaleic acid, etc., and polyhydric phenols such as hydroquinone, resorcinol, catechol or pyrogallol, etc.

Examples of esters of aliphatic polyol compounds and unsaturated carboxylic acids include the following compounds:

As acrylic acid esters, there are ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate and polyester acrylate oligomers, etc.

As methacrylic acid esters, there are tetramethylene glycol dimethacrylate, triethylene glycol dimethacrylate, trimethylolpropane trimethacrylate, trimethylolethane trimethacrylate, pentaerythritol dimethacrylate, pentaerythritol trimethacrylate, dipentaerythritol dimethacrylate, dipentaerythritol tetramethacrylate, tripentaerythritol octamethacrylate, ethylene glycol dimethacrylate, 1,3-butanediol dimethacrylate, tetramethylene glycol dimethacrylate and sorbitol tetramethacrylate, etc.

As itaconic acid esters, there are ethylene glycol diitaconate, propylene glycol diitaconate, 1,3-butanediol diitaconate, 1,4-butanediol diitaconate, tetramethylene glycol diitaconate, pentaerythritol diitaconate, dipentaerythritol triitaconate, dipentaerythritol pentaitaconate, dipentaerythritol hexaitaconate and sorbitol tetraitaconate, etc.

As crotonic acid esters, there are ethylene glycol dicrotonate, propylene glycol dicrotonate, tetramethylene glycol dicrotonate, pentaerythritol dicrotonate and sorbitol tetracrotonate, etc.

As isocrotonic acid esters, there are ethylene glycol diisocrotonate, pentaerythritol diisocrotonate and sorbitol tetraisocrotonate, etc.

As maleic acid esters, there are ethylene glycol dimaleate, triethylene glycol dimaleate, pentaerythritol dimaleate and sorbitol tetramaleate, etc.

Further, mixtures of the above-described acrylic, methacrylic, itaconic, etc. esters may be used.

As esters of oligoesters (or polyesters) having hydroxyl groups in the molecule and unsaturated aliphatic carboxylic acids, there are oligoester acrylates and oligoester methacrylates (they are called hereinafter oligoester acrylates (methacrylates)). The oligoester acrylates (methacrylates) are reaction products produced by esterification reactions of acrylic acid or methacrylic acid, polybasic carboxylic acids and polyols, which are compounds having a presumed structure represented by the general formula (7):

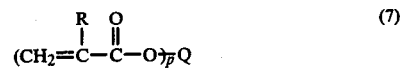

where R represents a hydrogen atom or a methyl group, Q represents an ester residue containing at least one ester bond composed of polyhydric alcohols and polybasic carboxylic acids, and p represents an integer of 1 to 6.

As the polyols composing the ester residue Q, there are, for example, polyols such as ethylene glycol, 1,2-propylene glycol, 1,4-butanediol, 1,6-hexanediol, trimethylolpropane, trimethylolethane, 1,2,6-hexanetriol, glycerine, pentaerythritol or sorbitol, etc., and polyether polyols such as diethylene glycol, triethylene glycol, tetraethylene glycol, decaethylene glycol, tetradecaethylene glycol, polyethylene glycol, dipropylene glycol, tripropylene glycol, tetrapropylene glycol or polypropylene glycol, etc.

On the other hand, as the polybasic carboxylic acids composing the ester residue Q, there are, for example, aromatic polybasic carboxylic acids such as phthalic acid, isophthalic acid, terephthalic acid, tetrachlorophthalic acid, tetrabromophthalic acid, trimellitic acid, pyromellitic acid or benzophenone-2,3-dicarboxylic acid, etc., unsaturated aliphatic polybasic carboxylic acids such as maleic acid, fumaric acid, himic acid or itaconic acid, etc., and saturated aliphatic polybasic carboxylic acids such as malonic acid, succinic acid, glutaric acid, adipic acid, pimelic acid, sebacic acid, dodecanedioic acid or tetrahydrophthalic acid, etc.

The ester residue Q may be composed of one kind of polyol and one kind of polybasic carboxylic acid or of two or more kinds of the polyols and/or the polybasic carboxylic acids. Further, the ester residue Q may contain one molecule of polyol and one molecule of polybasic carboxylic acid or contain two or more molecules of the polyol and/or the polybasic carboxylic acids. Namely, any ester residue can be used as Q if at least one ester bond is present. Further, the ester residue Q may contain a hydroxyl group or a hydroxyl group esterified with a monobasic carboxylic acid or substituted by an alkoxy group such as a methoxy group or an ethoxy group. Further, the ester residue Q may contain a carboxylic acid group. The number of p in the general formula (7) and the number of the ester bonds included in Q are in general in the range of 1 to 6. In case that p is 2 or more, though the polyester (meth)acrylates used may contain either the acryloyl group or the methacryloyl group in the molecule, they may contain both of the acryloyl group and the methacryloyl group in the molecule in a suitable ratio. Examples of presumed structural formulae of oligoester acrylates (methacrylates) are shown in Table 1. In addition to these, examples of oligoesters include unsaturated esters described in Japanese Patent Application (OPI) No. 9676/72 (the term "OPI" as used herein refers to a "published unexamined Japanese patent application") (corresponding to U.S. Pat. No. 3,732,107). In Table 1, Y represents an acryloyl group or a methacryloyl group.

TABLE 1

Oligoester (Meth)Acrylates $Y-OCH_2CH_2OOC-CH=CH-COOCH_2CH_2OH$ $Y-OCH_2\overset{\underset{|}{CH_3}}{CH}-OOC-CH_2CH_2-COO-\overset{\underset{|}{CH_3}}{CH}CH_2OH$ $Y-O(CH_2CH_2O)_{\overline{l}}OC-C_6H_4-CO(OCH_2CH_2)_{\overline{l}}OH$ $Y-[O(CH_2)_{\overline{n}}OOC(CH_2)_{\overline{n}}CO]_{\overline{l}}O(CH_2)_{\overline{n}}OOC-CH_3$ $Y-OCH_2CH_2OOC-C_6H_4-COOCH_2CH_2-O-Y$ $Y(OCH_2CH_2OOC-C_6H_4-CO)_{\overline{l}}OCH_2CH_2O-Y$ $Y-O(CH_2CH_2O)_{\overline{3}}OC-CH=CH-CO(OCH_2CH_2)_{\overline{3}}O-Y$ $Y-OCH_2CH_2OOC\underset{\text{[norbornene]}}{\diagup\diagdown}COOCH_2CH_2O-Y$ $Y-[(OCH_2CH_2)_{\overline{3}}OOC(CH_2)_{\overline{n}}CO]_{\overline{l}}O(CH_2CH_2O)_{\overline{3}}Y$ $Y-[(OCH_2CH_2)_{\overline{l}}OOC-C_6H_4-CO]_{\overline{3}}O(CH_2CH_2O)_{\overline{l}}Y$ $Y(OCH_2CH_2)_{\overline{10}}-OOC-CH_2-COO(CH_2CH_2O)_{\overline{10}}-Y$ $Y(OCH_2CH_2)_{\overline{10}}-OOC\underset{\text{[benzophenone-diCOO]}}{\diagup\diagdown}COO(CH_2CH_2O)_{\overline{10}}-Y$ $Y-OCH_2CH_2OOC\diagdown\diagup COO-CH_2CH_2-O-Y$
$Y-OCH_2CH_2OOC\diagup$ $Y(OCH_2CH_2)_{\overline{l}}OOC\diagdown\diagup COO(CH_2CH_2O)_{\overline{l}}Y$
$Y(OCH_2CH_2)_{\overline{l}}OOC\diagup$ $\begin{array}{cc} Y-OCH_2\diagdown & \diagup CH_2O-Y \\ \phantom{Y-OCH_2}CH-OOC-C_6H_4-COO-CH \\ Y-OCH_2\diagup & \diagdown CH_2O-Y \end{array}$ $\begin{array}{cc} Y-OCH_2\diagdown & \diagup CH_2O-Y \\ \phantom{Y-OCH_2}CH-OOC(CH_2)_{\overline{n}}COO-CH \\ Y-OCH_2\diagup & \diagdown CH_2O-Y \end{array}$ $\begin{array}{cc} Y-OCH_2\diagdown\diagup C_2H_5 & C_2H_5\diagdown\diagup CH_2O-Y \\ \phantom{Y-OCH_2}C & C \\ Y-OCH_2\diagup\diagdown CH_2OOC-C_6H_4-COOCH_2 & \diagdown CH_2O-Y \end{array}$ $\begin{array}{cc} Y-OCH_2\diagdown\diagup C_2H_5 & C_2H_5\diagdown\diagup CH_2O-Y \\ \phantom{Y-OCH_2}C & C \\ Y-OCH_2\diagup\diagdown CH_2OOC-CH=CH-COOCH_2 & \diagdown CH_2O-Y \end{array}$ $\begin{array}{cc} Y-OCH_2\diagdown\diagup CH_3 & CH_3\diagdown\diagup CH_2O-Y \\ \phantom{Y-OCH_2}C & C \\ Y-OCH_2\diagup\diagdown CH_2OOC(CH_2)_{\overline{l}}COOCH_2 & \diagdown CH_2O-Y \end{array}$

TABLE 1-continued
Oligoester (Meth)Acrylates

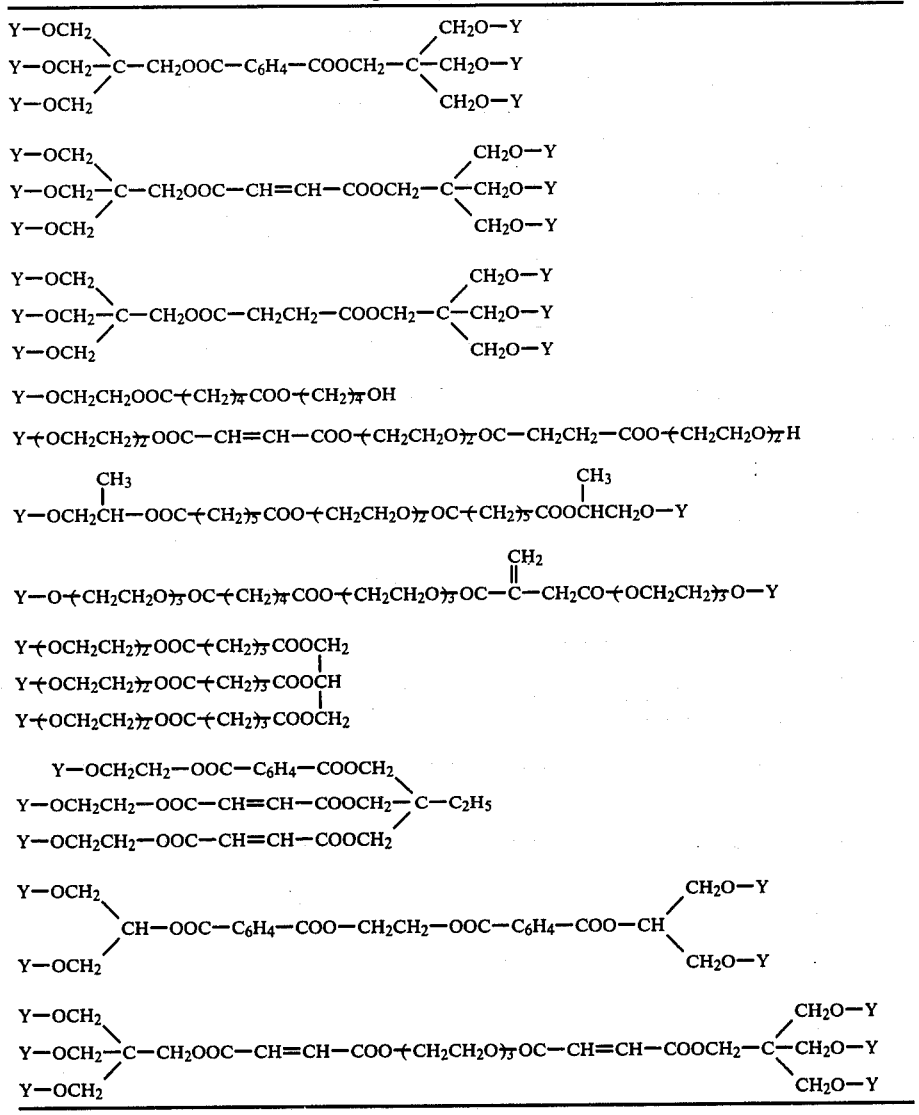

The photopolymerization initiator is the component which forms redicals by application of actinic radiation and has a function of initiating the addition-polymerization of the ethylenic compounds by reacting the above-described radicals with the ethylenic compounds.

The substituents $R^1$, $R^2$, and $R^3$ of p-dialkylamino aromatic carbonyl compounds represented by the formulae (1) to (4) each represents an alkyl group including a substituted alkyl group, which may be the same or different. The alkyl group may be a straight or branched chain alkyl group having 1 to 18 carbon atoms and cyclic alkyl groups having 5 to 18 carbon atoms. Examples include a methyl group, an ethyl group, a propyl group, a butyl group, a pentyl group, a hexyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group, a 2-norbornyl group, an α-decalyl group and a β-decalyl group. Among these, preferred are straight and branched chain alkyl groups having 1 to 10 carbon atoms and cycloalkyl groups having 6 to 10 carbon atoms.

Substituents of the substituted alkyl groups include halogen atoms (e.g., fluorine, chlorine, bromine andiodine) and a hydroxyl group. On the other hand, as the alkyl groups, there are straight, branched and cyclic alkyl groups having 1 to 18 carbon atoms and preferably 1 to 10 carbon atoms. Examples of the substituted alkyl group include a chloromethyl group, a bromomethyl group, a 2-chloroethyl group, a 2,2,2-trichloroethyl group, a 2-chloropentyl group, a 1-(chloromethyl)propyl group, a 10-bromodecyl group, an 18-methyloctadecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group and a 3-hydroxy-2-norbornyl group.

The substituent X of p-dialkylamino aromatic carbonyl compounds represented by the general formula (1) represents substituents having the Hammett's $\sigma$ value in a range from $-0.9$ to $+0.7$. For the present specification, the Hammett's $\sigma$ value is defined in J. E. Leffler and E. Graunwald, *Rates and Equilibria of Organic Reactions*, John Wiley & Sons Inc., New York (1963). Examples include a hydrogen atom, a methyl group, an ethyl group, an isopropyl group, a tert-butyl group, a phenyl group, a trifluoromethyl group, a cyano group, an acetyl group, an ethoxycarbonyl group, a carboxyl group, a carboxylato group (—COO$^-$), an amino group, a methylamino group, a dimethylamino group, an ethylamino group, a diethylamino group, an acetylamino group, —PO$_3$H, a methoxy group, an ethoxy group, a propoxy group, an isopropoxy group, a butoxy group, a pentyloxy group, a phenoxy group, a hydroxyl group, an acetoxy group, a methylthio group, an ethylthio group, an isopropylthio group, a mercapto group, an acetylthio group, a thiocyano group (—SCN), a methylsulfinyl group, an ethylsulfinyl group, a methylsulfonyl group, an ethylsulfonyl group, an aminosulfonyl group, a dimethylsulfonyl group (—S$^+$(CH$_3$)$_2$), a sulfonato group (—SO$_3^-$), a fluorine atom, a chlorine atom, a bromine atom, an iodine atom, an iodyl group, a trimethylsilyl group (—Si(CH$_3$)$_3$), a triethylsilyl group and a trimethylstannyl group (—Sn(CH$_3$)$_3$). Among these substituents, the hydrogen atom, the methyl group, the ethyl group, the methoxy group, the ethoxy group, the dimethylamino group, the diethylamino group, the chlorine atom, the bromine atom and the cyano group are preferred.

The p-dialkylamino aromatic carbonyl compounds represented by the general formula (1) are p-dialkylaminostyryl styryl ketone derivatives or p-dialkylaminostyryl 4-phenyl-1,3-butadienyl ketone derivatives. Examples include (a-1) p-dimethylaminostyryl p-cyanostyryl ketone, (a-2) p-dimethylaminostyryl p-chlorostyryl ketone, (a-3) p-dimethylaminostyryl m-chlorostyryl ketone, (a-4) p-dimethylaminostyryl p-bromostyryl ketone, (a-5) p-dimethylaminostyryl m-bromostyryl ketone, (a-6) p-dimethylaminostyryl styryl ketone, (a-7) p-dimethylaminostyryl m-methylstyryl ketone, (a-8) p-dimethylaminostyryl p-methylstyryl ketone, (a-9) p-dimethylaminostyryl p-ethylstyryl ketone, (a-10) p-dimethylaminostyryl m-ethylstyryl ketone, (a-11) p-dimethylaminostyryl p-methoxystyryl ketone, (a-12) p-dimethylaminostyryl m-methoxystyryl ketone, (a-13) p-dimethylaminostyryl p-ethoxystyryl ketone, (a-14) bis(p-dimethylaminostyryl)ketone, (a-15) p-diethylaminostyryl p-cyanostyryl ketone, (a-16) p-diethylaminostyryl p-bromostyryl ketone, (a-17) p-diethylaminostyryl m-chlorostyryl ketone, (a-18) p-diethylaminostyryl styryl ketone, (a-19) p-diethylaminostyryl p-methylstyryl ketone, (a-20) p-diethylaminostyryl m-ethylstyryl ketone, (a-21) p-diethylaminostyryl p-methoxystyryl ketone, (a-22) p-diethylaminostyryl m-ethoxystyryl ketone, (a-23) bis(p-diethylaminostyryl)ketone, (a-24) p-dimethylaminostyryl 4-phenyl-1,3-butadienyl ketone, (a-25) p-dimethylaminostyryl 4-(p-chlorophenyl)-1,3-butadienyl ketone, (a-26) p-dimethylaminostyryl 4-(p-methoxyphenyl)-1,3-butadienyl ketone, (a-27) p-dimethylaminostyryl 4-(m-chlorophenyl)-1,3-butadienyl ketone, (a-28) p-dimethylaminostyryl 4-(p-cyanophenyl)-1,3-butadienyl ketone, (a-29) p-dimethylaminostyryl 4-(p-dimethylaminophenyl)-1,3-butadienyl ketone, (a-30) p-dimethylaminostyryl 4-p-tolyl-1,3-butadienyl ketone, (a-31) p-dimethylaminostyryl 4-m-tolyl-1,3-butadienyl ketone and (a-32) p-dimethylaminostyryl 4-(p-bromophenyl)-1,3-butadienyl ketone.

The p-dialkylamino aromatic carbonyl compounds represented by the general formula (2) are 2-(p-dialkylaminocinnamoylmethylene)-3-alkylbenzothiazolines. Examples include (a-33) 2-[p-(dimethylamino)cinnamoylmethylene]-3-methylbenzothiazoline, (a-34) 2-[p-(dimethylamino)cinnamoylmethylene]-3-ethylbenzothiazoline and (a-35) 2-[p-(diethylamino)cinnamoylmethylene]-3-ethylbenzothiazoline.

The p-dialkylamino aromatic carbonyl compounds represented by the general formula (3) are 2-(p-dialkylaminocinnamoylmethylene)-1-alkyl-3,3-dimethylindolenines (or 2-(p-dialkylaminocinnamoylmethylene)-1-alkyl-3,3-dimethyl-3H-indoles). Examples include (a-36) 2-[p-(dimethylamino)cinnamoylmethylene]-1,3,3-trimethylindolenine, (a-37) 2-[p-(dimethylamino)cinnamoylmethylene]-1-ethyl-3,3-dimethylindolenine and (a-38) 2-[p-(diethylamino)cinnamoylmethylene]-1-ethyl-3,3-dimethylindolenine.

The p-dialkylamino aromatic carbonyl compounds represented by the general formula (4) are 2-(p-dialkylaminocinnamoylmethylene)-3-alkylbenzoxazolines. Examples include (a-39) 2-[p-(dimethylamino)cinnamoylmethylene]-3-methylbenzoxazoline, (a-40) 2-[p-(dimethylamino)cinnamoylmethylene]-3-ethylbenzoxazoline and (a-41) 2-[p-(diethylamino)cinnamoylmethylene]-3-ethylbenzoxazoline.

The compounds represented by the general formuae (1) to (4) can be synthesized as described in P. Pfeiffer and O. Angen, *Justus Liebigs Annalen der Chemie*, Vol. 44, pages 228–265 (1925); B. N. Dashkevich and I. V. Smedanka, *Ukrain. Khim. Zhur*, Vol. 21, pages 619–624 (1955); and I. V. Smedanka, *Nauch. Zapjski. Uzhgrod. Univ.*, Vol. 18, pages 15–19 (1957). For example, p-dimethylaminostyryl propyl ketone can be synthesized by a condensation reaction (Perkin reaction) of p-dimethylaminobenzaldehyde and propyl ethyl ketone, and p-dimethylaminochalcone can be synthesized by a condensation reaction (Perkin reaction) of p-dimethylaminobenzaldehyde and phenyl methyl ketone.

The substituents A$^1$ and A$^2$ of 5-isoxazolones represented by the general formula (5) as the component (b) each represents an alkyl group, a substituted alkyl group, an aryl group, a substituted aryl group, an alkoxycarbonyl group or a hydrogen atom, which may be the same or different from each other. As the alkyl groups, there are straight and branched alkyl groups having 1 to 5 carbon atoms. Examples include a methyl group, an ethyl group, a propyl group, a butyl group, a pentyl group, an isopropyl group, an isobutyl group, an isopentyl group, a sec-butyl group, a neopentyl group and a tert-butyl group. Among them, the methyl group and the ethyl group are preferred.

As substituents of the substituted alkyl groups, there are halogen atoms (fluorine, chlorine, bromine and iodine atoms) and a hydroxyl group. On the other hand, as the alkyl moieties thereof, there are the same straight and branched alkyl groups having 1 to 5 carbon atoms as described above and preferably straight and branched alkyl groups having 1 to 3 carbn atoms. Examples include a hydroxymethyl group, a 2-hydroxyethyl group, a 3-hydroxypropyl group, a chloromethyl group, a bromomethyl group, a 2-chloroethyl group, a 2-bromoethyl group, a 2-iodoethyl group, etc.

As the alkylcarbonyl groups, there are alkylcarbonyl groups having 2 to 6 carbon atoms. Examples include an acetyl group, a propionyl group, a butyryl group, a valeryl group, an isobutyryl group, an isovaleryl group and a pivaloyl group. Among them, the acetyl group is preferred.

As the alkoxycarbonyl groups, there are those in which the alkyl moiety is a straight or branched alkyl group having 1 to 5 carbon atoms. Examples include a methoxycarbonyl group, an ethoxycarbonyl group, a propoxycarbonyl group, a butoxycarbonyl group, a pentyloxycarbonyl group, an isopropoxycarbonyl group, an isobutoxycarbonyl group and an isopentyloxycarbonyl group. Among them, the methoxycarbonyl group and the ethoxycarbonyl group are preferred.

As the aryl groups, there are a phenyl group, a p-tolyl group, an m-tolyl group or an o-tolyl group. A phenyl group is preferred. As the arylcarbonyl groups, there are a benzoyl group, a p-toluoyl group, an m-toluoyl group or an o-toluoyl group. A benzoyl group is preferred.

As the substituted aryl groups, there are aryl groups in which ring-forming carbon atoms of the above-described aryl group are substituted by 1 to 3 substituents selected from halogen atoms (fluorine, chlorine, bromine and iodine atoms), alkyl groups (straight or branched alkyl groups having 1 to 5 carbon atoms, examples of which include a methyl group, an ethyl group, a propyl group, a butyl group, a pentyl group, an isopropyl group, an isobutyl group and an isoamyl group) and alkoxy groups (alkoxy groups having a straight or branched alkyl group having 1 to 5 carbon atoms, in which examples of the alkyl group include a methyl group, an ethyl group, a propyl group, a butyl group, a pentyl group, an isopropyl group, an isobutyl group and an isoamyl group). In case of aryl groups having 2 or 3 substituents described above, the substituents may be the same or different. Examples of substituted aryl groups include a chlorophenyl group, a bromophenyl group, a methoxyphenyl group, an ethoxyphenyl group, a tolyl group and an ethylphenyl group.

$A^1$ and $A^2$ may be the same or different, as described above, but it is preferred that both $A^1$ and $A^2$ are not hydrogen atoms.

Examples of 5-isoxazolones represented by the general formula (5) include (b-1) 3-phenyl-5-isoxazolone, (b-2) 3-methyl-5-isoxazolone, (b-3) 3-ethyl-5-isoxazolone, (b-4) 3-acetyl-5-isoxazolone, (b-5) 4-ethoxycarbonyl-5-isoxazolone, (b-6) 3-(p-chlorophenyl)-5-isoxazolone, (b-7) 3-(p-methoxyphenyl)-5-isoxazolone and (b-8) 3-p-tolyl-5-isoxazolone.

The 5-isoxazolones represented by the general formula (5) can be synthesized by processes described in *Practical Heterocyclic Chemistry*, written by A. O. Fitton and R. K. Smalley, p. 29 (published by Academic Press Inc., London, 1968), *Heterocyclic Compounds*, edited by R. C. Elderfield, Vol. 5 (Isoxazoles) p. 472, and *Chemistry of Carbon Compounds*, edited by E. H. Rodd, Vol. IVA (Isoxazolines and Isoxazolones), p. 343. In particular, the 5-isoxazolones can be synthesized by reacting ethyl benzoylacetate with ammonium hydroxide in the presence of sodium acetate under reflux. The compounds described above as examples are all colorless solids at room temperature.

The substituents $R^4$, $R^5$ and $R^6$ of 2,4,6-substituted-1,3,5-triazines represented by the general formula (6) as the component (c) each represents an alkyl group, a substituted alkyl group, an aryl group, a substituted aryl group or an aralkyl group and may be the same or different from one another, but at least one of which represents a mono-, di- or trihalomethyl group. The alkyl groups and the substituted alkyl groups in $R^4$, $R^5$ and $R^6$ are the same as those described for the substituents $R^1$, $R^2$ and $R^3$, and the aryl groups and the substituted aryl groups in $R^4$, $R^5$ and $R^6$ are the same as those described for the substituents $A^1$ and $A^2$, respectively. In the case that $R^4$, $R^5$ and $R^6$ represent an aralkyl group, the aralkyl groups may contain an alkyl moiety which may be straight, branched or cyclic having 1 to 10 carbon atoms and preferably 1 to 5 carbon atoms substituted by a phenyl group or a naphthyl group. Examples include a benzyl group, a phenetyl group, a 3-phenylpropyl group, a 3-phenylhexyl group, a 10-phenyldecyl group, a 4-phenylcyclohexyl group, etc. The mono-, di- or trihalomethyl group is, for example, a chloromethyl group, a bromomethyl group, an iodomethyl group, a dichloromethyl group, a dibromomethyl group, a diiodomethyl group, a trichloromethyl group, a tribromomethyl group or a triiodomethyl group.

The 2,4,6-substituted-1,3,5-triazines represented by the general formula (6) can be synthesized according to processes described in T. R. Norton, *Journal of American Chemical Society*, "A New Synthesis of Ethyl Trifluoroacetate", Vol. 72, pp. 3527–3528 (1950) and T. L. Cairns, A. W. Larchar and B. C. McKusick, ibid., "The Trimerization of Nitriles at High Pressures", Vol. 74, pp. 5633–5636 (1952) and Ch. Crundmann, G. Weisse and S. Seide, *Justus Liebigs Annalen der Chemie*, "Über Triazine, III Über den Mechanismus der Polymerisation von Nitrilen zu 1,3,5-Triazinen", Vol. 577, pp. 77–95 (1952). For example, they are conveniently prepared by reacting trichlorocyanomethane in the presence of HCl and $AlBr_3$ at 0° C.

Examples of the 2,4,6-substituted-1,3,5-triazines represented by the general formula include (c-1) 2-methyl-4,6-bis(trichloromethyl)-1,3,5-triazine, (c-2) 2,4,6-tris(trichloromethyl)-1,3,5-triazine, (c-3) 2-methyl-4,6-bis(tribromomethyl)-1,3,5-triazine, (c-4) 2,4,6-tris(tribromomethyl)-1,3,5-triazine, (c-5) 2,4,6-tris(dichloromethyl)-1,3,5-triazine, (c-6) 2,4,6-tris(dibromomethyl)-1,3,5-triazine, (c-7) 2,4,6-tris(bromomethyl)-1,3,5-triazine, (c-8) 2,4,6-tris(chloromethyl)-1,3,5-triazine, (c-9) 2-phenyl-4,6-bis(trichloromethyl)-1,3,5-triazine, (c-10) 2-(p-methoxyphenyl)-4,6-bis(trichloromethyl)-1,3,5-triazine, (c-11) 2-phenyl-4,6-bis(tribromomethyl)-1,3,5-triazine, (c-12) 2-(p-chlorophenyl)-4,6-bis(trichloromethyl)-1,3,5-triazine and (c-13) 2-(p-tolyl)-4,6-bis(trichloromethyl)-1,3,5-triazine.

An amount of the photopolymerization initiator present in the photopolymerizable compositions of the present invention may vary over a wide range from about 0.01% to about 20%, preferably from about 0.3% to about 10%, based on the weight of the ethylenic compound. Ratios (a):(b) and (a):(c) by weight in the photopolymerization initiator are both in a range from about 30:1 to about 1:30 and preferably in a range from about 10:1 to about 1:10.

In the photopolymerizable compositions of the present invention containing the above-described ethylenic compound and the photopolymerization initiator, it is possible to incorporate, if necessary, known additives such as high molecular substances having film-forming ability (binder), thermal polymerization inhibitors, plasticizers, coloring agents or surface smoothening agents, etc.

Particularly, in order to obtain resist (thick) images on photosensitive materials, such as in the case of photosensitive materials for carrying out stripping development or photosensitive materials for carrying out development by liquids as described below, it is desirable to use high molecular substances having film-forming ability (i.e., a binder).

Although any polymeric material can be used as the binder as long as it is compatible with the ethylenic compound and the photopolymerization initiator, it is preferred to select materials capable of development by stripping, by water or by a weak aqueous alkali solution. Namely, the polymeric material is used not only as a film-forming agent for the compositions but also as having affinity for water, weak aqueous alkali solutions or organic solvents used as developing solutions.

For example, if a water-soluble polymeric material is used, development by water can be carried out. As such polymeric materials, there are addition-polymers having a carboxyl group in the side chains, for example, methacrylic acid copolymers, acrylic acid copolymers, itaconic acid copolymers, partially esterified maleic acid copolymers, maleic acid copolymers and crotonic acid copolymers, etc., and acid cellulose derivatives having a carboxyl group in the side chains. Further, hydroxyl group containing addition-polymers to which cyclic acid anhydride is added are suitably used. In addition, polyvinyl pyrrolidone and polyethylene oxide are suitably used as water-soluble polymers. Further, in order to increase film strength of areas hardened by exposure, alcohol-soluble nylon and polyether of 2,2-bis(4-hydroxyphenyl)propane and epichlorohydrin are suitably used. These materials can be incorporated in a suitable amount based on the entire composition (exclusive of solvents). However, in amounts above 90% by weight, preferred results in terms of image strength are not obtained.

As linear polymeric materials used for photopolymerizable compositions which are stripping developable, there are chlorinated polyolefins (chlorine content: about 60% by weight to about 75% by weight) such as chlorinated polyethylene or chlorinated polypropylene, etc., and homopolymers and copolymers such as polymethyl methacrylate, polyacrylic acid, polymethacrylic acid, polyacrylic acid alkyl esters (examples of the alkyl group include a methyl group, an ethyl group and a butyl group), copolymers of acrylic acid alkyl ester and at least one monomer selected from acrylonitrile, vinyl chloride, vinylidene chloride, styrene and butadiene, polyvinyl chloride, vinyl chloride-acrylonitrile copolymer, polyvinylidene chloride, vinylidene chloride-acrylonitrile copolymer, polyvinyl acetate, vinyl acetate-vinyl chloride copolymer, polyvinyl alcohol, polyvinyl pyrrolidone, polyacrylonitrile, acrylonitrile-styrene copolymer, acrylonitrile-butadiene-styrene terpolymer, polyvinyl alkyl ethers (examples of the alkyl group include a methyl group, an ethyl group, an isopropyl group, and a butyl group), polymethyl vinyl ketone, polyethyl vinyl ketone, polyethylene, polypropylene, polybutene, polystyrene, poly-α-methylstyrene, polyamides (6-nylon or 6,6-nylon, etc.), poly-1,3-butadiene, polyisoprene, polyurethane, polyethylene terephthalate, polyethylene isophthalate, chlorinated rubber, polychloroprene, ethylcellulose, acetylcellulose, polyvinyl butyral, polyvinyl formal, styrene-butadiene rubber or chlorosulfonated polyethylene, etc. In case of copolymers, though a ratio of monomers may be varied in a wide range, it is generally preferred that the ratio by mol of the minor monomer component is in the range of 10% to 50%. Further, thermoplastic high molecular substances other than the above-described substances can be used in the present invention, if they satisfy the compatibility condition.

Among the above-described polymers, those preferably used together with the photopolymerizable compositions of the present invention are chlorinated polyethylene (chlorine content: about 60% to 75% by weight), chlorinated polypropylene (chlorine content: about 60% to 75% by weight), polymethyl methacrylate, polyvinyl chloride, vinyl chloride-vinylidene chloride copolymer (molar ratio of vinyl chloride about 20 to 80%), vinylidene chloride-acrylonitrile copolymer (molar ratio of acrylonitrile about 10 to 30%), vinyl chloride-acrylonitrile copolymer (molar ratio of acrylonitrile about 10 to 30%), polystyrene, polyvinyl butyral, polyvinyl acetate, polyvinyl formal, ethylcellulose, acetylcellulose, vinyl chloride-vinyl acetate copolymer, polychloroprene, polyisoprene, chlorinated rubber and chlorosulfonated polyethylene.

Although the polymeric materials may be used alone, two or more of them may be used in a suitable ratio so as not to cause separation during production steps comprising preparation of coating solutions, application thereof and drying.

The above-described polymers are incorporated as the binder in the photopolymerizable compositions of the present invention, an amount by weight of generally about 10% to 500% and preferably about 20% to 200% based on the weight of the ethylenic compound, though a range of forming excellent images varies with each polymer.

Known additives such as thermal polymerization inhibitors, plasticizers, coloring agents, surface smoothing agents or surface protecting agents, etc., may be added to the photopolymerizable compositions of the present invention, if necessary.

Examples of the thermal polymerization inhibitors include p-methoxyphenol, hydroquinone, alkyl- or aryl-substituted hydroquinones, t-butylcatechol, pyrogallol, phenothiazine, chloranil, naphthylamine, β-naphthol, 2,6-di-t-butyl-p-cresol, pyridine, nitrobenzene, dinitrobenzene, p-toluidine, etc. These thermal polymerization inhibitors can be contained in an amount of about 0.001% to 5% and preferably about 0.01% to 3% based on the weight of the ethylenic compound. The thermal polymerization inhibitors improve stability of the photopolymerizable compositions of the present invention to the lapse of time before use (before exposure to light).

As the coloring agents, there are pigments such as titanium oxide, carbon black, iron oxide, phthalocyanine pigments or azo pigments, etc., and dyes such as Methylene Blue, Crystal Violet, Rhodamine B, Fuchsine, Auramine, azo dyes or anthraquinone dyes, etc. However, it is preferred that the coloring agents used do not absorb light having absorption wavelengths of the photopolymerization inhibitor. The coloring agents are preferably added in an amount, based on a total of 100 parts by weight of the ethylenic compound and the photopolymerization inhibitor, of 0.1 part by weight to 30 parts by weight in case of pigments and from 0.01 part by weight to 10 parts by weight and, preferably from 0.1 part by weight to 10 parts by weight in case of dyes. In case of incorporating the above-described coloring agents, it is preferred to use dichloromethyl stearate or other chlorinated aliphatic acids as a supplemental material for coloring agents, which can be used in an amount of from 0.005 part by weight to 0.5 part by weight based on 1 part by weight of the coloring agents. But in cases where plasticizers are contained in the photopolymerizable compositions, the supplemental material is not necessary.

As plasticizers, there are phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate, etc., glycol esters such as dimethylglycol phthalate, ethylphthalyl ethyl glycolate, methylphthalyl ethyl glycolate, butylphthalyl butyl glycolate or triethylene glycol dicaprylate, etc., phosphoric acid esters such as tricresyl phosphate or triphenyl phosphate, etc., aliphatic dibasic acid esters such as diisobutyl adipate, dioctyl adipate, dimethyl sebacate, dibutyl sebacate, dioctyl azelate or dibutyl maleate, etc., triethyl citrate, glycerine triacetyl ester and butyl laurate. As the surface smoothing agents, there are lanolin, paraffin wax, natural wax, etc.

Surface protecting agents are materials which have poor compatibility with the photopolymerizable composition and, consequently, are separated on the surface of the photopolymerizable composition layer as layer, discontinuous islands or particle form, by which the surface of the photopolymerizable composition layer is protected. They also function to prevent polymerization inhibition by oxygen in the air. As the surface protecting agents, there are polystyrene, aliphatic carboxylic acids having 12 or more carbon atoms and amides thereof. Examples of the aliphatic carboxylic acids having 12 or more carbon atoms include lauric acid, myristic acid, palmitic acid, stearic acid, nonadecanoic acid, arachic acid, behenic acid, cerotic acid, heptacosanoic acid, montanic acid, melissic acid, lacceric acid, etc. Examples of aliphatic acid amides having 12 or more carbon atoms include amides of the above-described aliphatic acids.

The above-described various additives can be used in an amount of up to about 3% by weight and preferably up to about 1% by weight based on the whole weight of the photopolymerizable composition (exclusive of solvents).

The most general way of using the photopolymerizable compositions of the present invention is that they are used as photopolymerizable photosensitive materials which are prepared by dissolving the photopolymerizable composition in a solvent to produce a solution thereof, applying it to a base by the known method, and removing the solvent (drying).

As the solvents, there are ketones such as acetone, methyl ethyl ketone, methyl isobutyl ketone, cyclohexanone or diisobutyl ketone, etc., esters such as ethyl acetate, butyl acetate, amyl acetate, methyl formate, ethyl propionate, dimethyl phthalate or ethyl benzoate, etc., aromatic hydrocarbons such as toluene, xylene, benzene or ethylbenzene, etc., halogenated hydrocarbons such as carbon tetrachloride, trichloroethylene, chloroform, 1,1,1-trichloroethane, monochlorobenzene or chloronaphthalene, etc., ethers such as tetrahydrofuran, diethyl ether, ethylene glycol monomethyl ether or ethylene glycol monoethyl ether acetate, etc., dimethylformamide and dimethyl sulfoxide.

As bases to which the photopolymerizable composition of the present invention is applied in a suitable form (for example, the above-described solution), there are flat materials which do not undergo remarkable dimensional change and materials having other shapes. Examples of the flat materials include glass, silicon oxide, ceramics, paper, metals, for example, aluminium, zinc, magnesium, copper, iron, chromium, nickel, silver, gold, platinum, palladium, alloys comprising aluminium as the principal component, alloys comprising zinc as the principal component, alloys comprising magnesium as the principal component, copper-zinc alloy, iron-nickel-chromium alloy and alloys comprising copper as the principal component, metal compounds, for example, aluminium oxide, tin oxide ($SnO_2$) and indium oxide ($In_2O_3$) and polymers, for example, regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonate of bisphenol A, polyethylene, polypropylene, nylons (6-nylon, B 6,6-nylon and 6,10-nylon, etc.), polyvinyl chloride, vinyl chloride-vinyl acetate copolymer, vinyl chloride-acrylonitrile copolymer, vinyl chloride-vinylidene chloride copolymer, polyacrylonitrile, polymethyl acrylate and polymethyl methacrylate. Further, it is possible to use laminates composed of two or more thin layer of the above-desribed materials, for example, cermet, iron-aluminium laminated plates, iron-copper-aluminium laminated plates, iron-chromium-copper laminated plates, paper the surface of which is coated with polyethylene, paper the surface of which is coated with cellulose triacetate, aluminium plates having an aluminium oxide layer on the surface thereof which are obtained by anodic oxidation, chromium plates having a chromium oxide layer on the surface thereof which are obtained by the known method, glass plates having a tin oxide layer on the surface thereof and silicon oxide plates having an indium oxide layer on the surface thereof, as the base.

The bases may be transparent or opaque according to the purpose of the photosensitive image-forming material. In the case of transparent bases, it is possible to use not only colorless transparent bases but also colored transparent bases prepared by adding dyes or pigments as described in J. SMPTE, Vol. 67, p. 296 (1958). In case of opaque bases, it is possible to use not only essentially opaque bases such as paper or metal but also bases prepared by adding dyes or pigments such as titanium oxide to transparent materials, plastic films the surface of which is processed by the process described in Japanese Patent Publication No. 19068/72 (corresponding to British Pat. No. 1,237,475) and completely light-interceptive paper and plastic films prepared by adding carbon black. Further, it is possible to use bases having fine hollows on the surface which are prepared by processing such as sanding, electrolytic etching, anodic oxidation or chemical etching, etc., and bases the surface of which was subjected to a preliminary treatment such as corona discharging, ultraviolet ray application or flame treatment, etc. Moreover, it is possible to use plastic bases in which reinforcing agents such as glass fibers, carbon fibers, boron fibers, metal fibers or metal whiskers are mixed to improve strength.

The bases may have, if necessary, another coating layer in order to improve adhesion, an antihalation layer, an ultraviolet ray absorbing layer or a visible ray absorbing layer on the surface thereof.

Further, in order to prevent deterioration of sensitivity of the compositions of the invention by oxygen, it is possible that exposing to light is carried out using a vacuum printing frame described in U.S. Pat. No. 3,060,026, or a removable transparent cover is provided or a coating layer having a low oxygen permeability is provided on the photosensitive layer as described in Japanese Patent Publication No. 17828/65 (corresponding to U.S. Pat. No. 3,203,805).

Factors for defining the rate of hardening of the photopolymerizable compositions in the present invention by photopolymerization include the base and, particularly, the surface properties thereof, the specific components in the composition, the amount of the photopolymerization initiator in the composition, the thickness of the photopolymerizable composition layer, the light source (characteristics of radiation spectra), intensity, the presence or absence of oxygen and the temperature of environment, etc.

Exposure to light may be carried out by any suitable method or a combination of methods. For example, the composition may be exposed to actinic radiation from any light source, if an effective exposure is applied. The photopolymerizable compositions of the present invention are generally highly sensitive in the region of ultraviolet radiation and visible light from about 180 nm to about 450 nm wavelength, or from about 180 nm to about 540 nm of the wavelength if a suitable dialkylamino aromatic carbonyl compound is chosen as component (b) in the photopolymerization initiator. However, since the compositions of the present invention are sensitive to vacuum ultraviolet radiation (ultraviolet radiation in the region from about 1 nm to about 180 nm of the wavelength), X rays, electromagnetic waves having short wavelengths in the range of $\gamma$-rays, and corpuscular rays such as electron beams, neutron beams, or $\alpha$-rays, etc., these forms of radiation can also be utilized for image exposure. Examples of suitable light sources in the ultraviolet region and visible region include carbon arc lamps, mercury vapor lamps, xenon lamps, fluorescent lamps, argon glow discharge tubes, flood lamps for photography, Van de Graaff accelerators, etc.

The light exposure time should be sufficient to afford an effective exposure amount. Though exposure may be carried out at a suitable temperature, it is the most suitable to expose at room temperature, namely, 10° C. to 40° C., for practical reasons.

The compositions of the present invention hardened by light are dry and elastic and show abrasion resistance and chemical resistance. Further, they have an excellent ink-receiving property, hydrophilic-hydrophobic equilibrium, stain dissolving property and initial roll-up property (the number of printing before a practicable print is obtained) and have availability as previously sensitized printing materials for lithography and photoresist, etc. Of course, the compositions of the present invention can be used for printing inks, adhesives for metal foils, films, paper or fabrics, etc., light-hardenable coating for metal, plastics, paper, wood, metal foils, fabrics, glass, thick paper and thick paper for boxes, road marking, parking places, air ports, etc.

In case that the compositions of the present invention are used, for example, as vehicles for printing inks, they can be colored by dyes and at the same time by various known pigments such as molybdate orange, titanium white, chrome yellow, phthalocyanine blue, carbon black, etc. Further, a suitable amount of the vehicle is in the range of from about 20% to 99.9% based on the weight of the composition. The coloring agents can be used in an amount of about 0.1% to 80% by weight. The printing materials include clay coated paper and thick paper for box making.

The compositions of the present invention are suitable for processing fabrics of natural fibers and snythetic fibers, too. For example, they can be used in vehicles of printing inks for cloth, or in vehicles for special fabric treatment, such as for waterproofing, an oil resisting property, an anti-stain property or an anti-creasing property, etc.

When the compositions of the present invention are used as adhesives, at least one of articles to be bonded must be transparent to ultraviolet radiation or visible light. Typical examples of laminates obtained by bonding with using the compositions of the present invention include cellophane coated with a polymer, for example, cellophane coated with polypropylene, metal such as aluminium or copper which is covered with a polyethylene terephthalate film and aluminium which is coated with polypropylene.

The photopolymerizable compositions of the present invention can be used as coatings for application to or printing on the surface of metal, glass or plastic articles by a roll method and a spray method. Further, a colored coating method may be used for glass, polyester films, vinyl polymer films, polymer coated cellophane, treated or untreated polyethylene or treated or untreated polypropylene used for cups which are thrown away after use or bottles. Examples of metal to be coated include tin plates optionally subjected to sizing.

The photopolymerizable photosensitive image-forming materials prepared using the photopolymerizable compositions of the present invention are materials which have a photosensitive layer composed of the composition of the present invention on the surface of a sheet or plate base.

As one type of the photosensitive image-forming material using the composition of the present invention, there is a material which comprises a layer of the composition of the present invention provided on the surface of a base and a transparent plastic film overlying the layer. The transparent plastic film is stripped from materials having this structure before image exposure. Further, they can be particularly advantageously used as so-called stripping development type sensitive materials where they are imagewise exposed through the transparent plastic film or through the base when the base is transparent, and the transparent plastic film is then removed by stripping, whereby the hardened portions of the layer which were polymerized by exposure remain on the base and the unhardened portions which were not exposed remain on the transparent plastic film or vice versa.

In the photosensitive image-forming materials using the compositions of the present invention, the image exposure concludes by exposing specified parts of the layer of photopolymerizable composition till the addition polymerization reaction in the exposed parts is finished at the desired thickness. Then the unexposed parts of the composition layer are removed using a solvent which does not dissolve the polymer but dissolves only the unpolymerized ethylenic compounds (monomers or oligomers) or by so-called stripping development. In case of using the composition for the photosensitive image-forming materials, the thickness of the photopolymerizable composition after removal by the solvent (drying) is in a range from about 0.5 $\mu$m to about 150 $\mu$m and preferably from about 2 $\mu$m to about 100 $\mu$m. The flexibility decreases as the thickness of the layer increases, while the abrasion resistance decreases as the thickness of the layer decreases.

In case of using as printing inks, coating compositions and adhesives, the compositions of the present invention can be used without using volatile solvents. In these cases, they have several excellent characteristics as compared with known oil-containing resin type or solvent type inks or coatings.

In the photopolymerizable compositions of the present invention, it is possible to obtain those having a high sensitivity to radiation having wavelengths from about 180 nm to about 540 nm by choosing a suitable compound from dialkylamino aromatic carbonyl compounds as component (b) of the photopolymerization initiator. Further, since the photopolymerization initiator used in the present invention has always a high sensitivity to radiation having wavelengths from about 180 nm to at least about 450 nm, it is possible to use not only high pressure mercury lamp, ultra-high pressure mercury lamps, high pressure xenon-mercury lamps, high pressure xenon lamps, halogen lamps and fluorescent lamps used for the prior photopolymerizable compositions but also argon lasers having 488 nm and 514.5 nm wavelength, which makes the compositions of the present invention superior to prior photopolymerizable compositions. Particularly, since exposure by scanning can be carried out using the argon laser, they have very wide applications. Further, the photopolymerizable compositions of the present invention have a very high photopolymerization velocity, namely, a high sensitivity, because the photopolymerization initiator composed of a combination of easily available compounds is used. Further, since the above-described photopolymerization initiator generally affords a high photopolymerization velocity to all polymerizable compounds having ethylenically unsaturated double bonds, the compositions of the present invention have wide applications and can be used as photosensitive layers of sensitive materials in various fields. For example, for production of printed circuited boards in the electronic industry, for production of lithographic, gravure or relief printing plates or for reproduction of images, etc. Accordingly, the present invention is very useful.

Below, the present invention is illustrated in concrete and detail with reference to examples of the present invention and comparison examples thereof.

EXAMPLES 1-38 AND COMPARISONS (1) Preparation of Sensitive Material
Photopolymerizable Compositions (solutions)
  Ethylenic compound: Pentaerythritol trimethacrylate
  Photopolymerization initiator: Component (a), component (b) and component (c) as in Tables 2 and 3.
  Binder: Chlorinated polyethylene: high molecular substance having about 69% by weight of chlorine content which has about 90 cps of the viscosity at 25° C. as a 40 wt% solution in toluene.
  Solvent: 1,2-Dichloroethane The components described in the tables were put in a container and solid components were dissolved with stirring for about 3 hours to prepare a homogeneous solution. The resulted solution was applied to an aluminium plate having 0.24 mm of the thickness, the surface of which was sanded by a conventional method and subjected to anodic oxidation, and it was dried at 80° C. for 10 minutes to obtain a photosensitive material. The thickness of the photopolymerizable composition layer (photosensitive layer) after dried was about 10 μm.

(2) Measurement of Sensitivity of Sensitive Material (2-1) A transparent polyethylene film having a 10 μm thickness was superposed on the photosensitive layer of the sensitive material obtained in (1). An optical wedge having 0.15 of the optical density step difference (the optical density step number was 0-15, the minimum optical density was 0.10 and the maximum optical density was 2.30) was put on the polyethylene film. After it was exposed imagewise to light for 5 seconds at the distance of 50 cm from a light source (super high pressure mercury lamp, output: 2 kw), the polyethylene film was removed and the photosensitive layer was developed for 30 seconds with using 1,1,1-trichloroethane. The maximum step number of the optical wedge corresponding to the developed image is the sensitivity of the sensitive material. The fact that the step number is higher (the numeral value is larger) means that the sensitivity is higher.

(2-2) A transparent polyethylene film was applied to the photosensitive layer of the sensitive material obtained in (1). The surface of the photosensitive layer was scanned at 4.3 m/sec. by an argon laser beam which discharged visible rays having wavelengths of 488 nm and 514.5 nm (the diameter of the beam was 100 μm on the surface of the photosensitive layer) with varying the exposure amount to 500 mW, 100 mW, 50 mW, 30 mW and 10 mW. Then, the polyethylene film was removed and the photosensitive layer was processed with 1,1,1-trichloroethane for 30 seconds, by which non-exposed non-polymerized areas were removed by dissolution and exposed polymerized areas remained on the aluminium plate to form the image. The minimum scan exposure amount at which the image was formed is the sensitivity of the sensitive material. The fact that the scan exposure amount at which the image is formed is lower means that the sensitivity is higher.

Results obtained as described above are shown in Tables 2 and 3 together with the binder and the photopolymerization initiators. Component (a), component (b) and component (c) are identified by the numbers of the above-described compounds and chemical structural formulae.

TABLE 2

| Examples 1-26 and Comparisons 1-24* | | | | | | | | | | | | | |
|---|---|---|---|---|---|---|---|---|---|---|---|---|---|
| Example/Comparison No. | C1 | C2 | C3 | C4 | C5 | C6 | C7 | C8 | C9 | C10 | C11 | C12 | C13 |
| Ethylenic Compound Pentaerythritol Trimethacrylate | 50 | 50 | 50 | 50 | 50 | 50 | 50 | 50 | 50 | 50 | 50 | 50 | 50 |
| Photopolymerization Initiator | | | | | | | | | | | | | |
| Component (a) | | | | | | | | | | | | | |
| (a-14) | 5 | — | — | — | — | — | — | — | — | — | — | — | — |
| (a-11) | — | 5 | — | — | — | — | — | — | — | — | — | — | — |
| (a-6) | — | — | 5 | — | — | — | — | — | — | — | — | — | — |
| (a-2) | — | — | — | 5 | — | — | — | — | — | — | — | — | — |
| (a-3) | — | — | — | — | 5 | — | — | — | — | — | — | — | — |
| (a-4) | — | — | — | — | — | 5 | — | — | — | — | — | — | — |

TABLE 2-continued
Examples 1-26 and Comparisons 1-24*

| | | | | | | | | | | | | | |
|---|---|---|---|---|---|---|---|---|---|---|---|---|---|
| (a-1) | — | — | — | — | — | — | 5 | — | — | — | — | — | — |
| (a-24) | — | — | — | — | — | — | — | 5 | — | — | — | — | — |
| (a-34) | — | — | — | — | — | — | — | — | 5 | — | — | — | — |
| (a-36) | — | — | — | — | — | — | — | — | — | 5 | — | — | — |
| (a-40) | — | — | — | — | — | — | — | — | — | — | 5 | — | — |
| Component (b) | | | | | | | | | | | | | |
| (b-1) | — | — | — | — | — | — | — | — | — | — | — | 5 | — |
| (b-7) | — | — | — | — | — | — | — | — | — | — | — | — | 5 |
| (b-6) | — | — | — | — | — | — | — | — | — | — | — | — | — |
| (b-8) | — | — | — | — | — | — | — | — | — | — | — | — | — |
| Component (c) | | | | | | | | | | | | | |
| (c-2) | — | — | — | — | — | — | — | — | — | — | — | — | — |
| (c-1) | — | — | — | — | — | — | — | — | — | — | — | — | — |
| Binder | | | | | | | | | | | | | |
| Chlorinated Polyethylene | 45 | 45 | 45 | 45 | 45 | 45 | 45 | 45 | 45 | 45 | 45 | 45 | 45 |
| Sensitivity (step)** | 2 | 2 | 1 | 2 | 2 | 3 | 2 | 0 | 1 | 1 | 1 | 0 | 0 |

| Example/Comparison No. | C14 | C15 | C16 | C17 | C18 | C19 | C20 | C21 | C22 | C23 | C24 | E1 | E2 |
|---|---|---|---|---|---|---|---|---|---|---|---|---|---|
| Ethylenic Compound | | | | | | | | | | | | | |
| Pentaerythritol Trimethacrylate | 50 | 50 | 50 | 50 | 50 | 50 | 50 | 50 | 50 | 50 | 50 | 50 | 50 |
| Photopolymerization Initiator | | | | | | | | | | | | | |
| Component (a) | | | | | | | | | | | | | |
| (a-14) | — | — | — | — | — | — | — | — | — | — | — | 1 | — |
| (a-11) | — | — | — | — | — | — | — | — | 3 | — | — | — | 1 |
| (a-6) | — | — | — | — | — | — | — | — | — | — | — | — | — |
| (a-2) | — | — | — | — | — | — | — | — | — | — | 2 | — | — |
| (a-3) | — | — | — | — | 3 | 3 | 3 | 2 | — | — | — | — | — |
| (a-4) | — | — | — | — | — | — | — | — | — | — | — | — | — |
| (a-1) | — | — | — | — | — | — | — | — | — | 3 | — | — | — |
| (a-24) | — | — | — | — | — | — | — | — | — | — | — | — | — |
| (a-34) | — | — | — | — | — | — | — | — | — | — | — | — | — |
| (a-36) | — | — | — | — | — | — | — | — | — | — | — | — | — |
| (a-40) | — | — | — | — | — | — | — | — | — | — | — | — | — |
| Component (b) | | | | | | | | | | | | | |
| (b-1) | — | — | — | — | 2 | — | — | — | — | — | — | 2 | 2 |
| (b-7) | — | — | — | — | — | — | — | — | 2 | — | — | — | — |
| (b-6) | 5 | — | — | — | — | 2 | — | — | — | — | — | — | — |
| (b-8) | — | 5 | — | — | — | — | — | — | — | 2 | — | — | — |
| Component (c) | | | | | | | | | | | | | |
| (c-2) | — | — | 5 | — | — | — | 2 | — | — | — | 3 | 2 | 2 |
| (c-1) | — | — | — | 5 | — | — | — | 3 | — | — | — | — | — |
| Binder | | | | | | | | | | | | | |
| Chlorinated Polyethylene | 45 | 45 | 45 | 45 | 45 | 45 | 45 | 45 | 45 | 45 | 45 | 45 | 45 |
| Sensitivity (step)** | 0 | 0 | 0 | 0 | 9 | 8 | 8 | 7 | 6 | 7 | 9 | 12 | 14 |

| Example/Comparison No. | E3 | E4 | E5 | E6 | E7 | E8 | E9 | E10 | E11 | E12 | E13 | E14 | E15 |
|---|---|---|---|---|---|---|---|---|---|---|---|---|---|
| Ethylenic Compound | | | | | | | | | | | | | |
| Pentaerythritol Trimethacrylate | 50 | 50 | 50 | 50 | 50 | 50 | 50 | 50 | 50 | 50 | 50 | 50 | 50 |
| Photopolymerization Initiator | | | | | | | | | | | | | |
| Component (a) | | | | | | | | | | | | | |
| (a-14) | — | — | — | — | — | — | — | — | — | 1 | — | — | — |
| (a-11) | — | — | — | — | — | — | — | — | — | — | 1 | — | — |
| (a-6) | 1 | — | — | — | — | — | — | — | — | — | — | 1 | — |
| (a-2) | — | 1 | — | — | — | — | — | — | — | — | — | — | 1 |
| (a-3) | — | — | 1 | — | — | — | — | — | — | — | — | — | — |
| (a-4) | — | — | — | 1 | — | — | — | — | — | — | — | — | — |
| (a-1) | — | — | — | — | 1 | — | — | — | — | — | — | — | — |
| (a-24) | — | — | — | — | — | 1 | — | — | — | — | — | — | — |
| (a-34) | — | — | — | — | — | — | 1 | — | — | — | — | — | — |
| (a-36) | — | — | — | — | — | — | — | 1 | — | — | — | — | — |
| (a-40) | — | — | — | — | — | — | — | — | 1 | — | — | — | — |
| Component (b) | | | | | | | | | | | | | |
| (b-1) | 2 | 2 | 2 | 2 | 2 | 2 | 2 | 2 | 2 | — | — | — | 2 |
| (b-7) | — | — | — | — | — | — | — | — | — | 2 | 2 | 2 | — |
| (b-6) | — | — | — | — | — | — | — | — | — | — | — | — | — |
| (b-8) | — | — | — | — | — | — | — | — | — | — | — | — | — |
| Component (c) | | | | | | | | | | | | | |
| (c-2) | 2 | 2 | 2 | 2 | 2 | 2 | 2 | 2 | 2 | — | — | — | — |
| (c-1) | — | — | — | — | — | — | — | — | — | 2 | 2 | 2 | 2 |
| Binder | | | | | | | | | | | | | |
| Chlorinated Polyethylene | 45 | 45 | 45 | 45 | 45 | 45 | 45 | 45 | 45 | 45 | 45 | 45 | 45 |
| Sensitivity (step)** | 11 | 13 | 14 | 12 | 13 | 11 | 11 | 13 | 13 | 12 | 10 | 11 | 11 |

| Example/Comparison No. | E16 | E17 | E18 | E19 | E20 | E21 | E22 | E23 | E24 | E25 | E26 |
|---|---|---|---|---|---|---|---|---|---|---|---|

TABLE 2-continued

Examples 1-26 and Comparisons 1-24*

| | | | | | | | | | | | |
|---|---|---|---|---|---|---|---|---|---|---|---|
| Ethylenic Compound | | | | | | | | | | | |
| Pentaerythritol Trimethacrylate | 50 | 50 | 50 | 50 | 50 | 50 | 50 | 50 | 50 | 50 | 50 |
| Photopolymerization Initiator | | | | | | | | | | | |
| Component (a) | | | | | | | | | | | |
| (a-14) | — | — | — | — | — | — | — | — | — | — | — |
| (a-11) | — | — | — | — | — | — | — | — | — | — | — |
| (a-6) | — | — | — | — | — | — | — | — | — | — | — |
| (a-2) | — | — | — | — | — | — | — | — | — | — | — |
| (a-3) | 1 | — | — | 1 | 1 | 1 | 1 | 1 | 2 | 2 | 2 |
| (a-4) | — | 1 | — | — | — | — | — | — | — | — | — |
| (a-1) | — | — | 1 | — | — | — | — | — | — | — | — |
| (a-24) | — | — | — | — | — | — | — | — | — | — | — |
| (a-34) | — | — | — | 1 | — | — | — | — | — | — | — |
| (a-36) | — | — | 1 | — | — | — | — | — | — | — | — |
| (a-40) | — | — | — | — | — | — | — | — | — | — | — |
| Component (b) | | | | | | | | | | | |
| (b-1) | — | — | — | 2 | 1 | — | — | — | 2 | 1 | 1 |
| (b-7) | — | — | — | — | — | — | 1 | — | — | — | — |
| (b-6) | 2 | 2 | — | — | — | — | — | — | — | — | — |
| (b-8) | — | — | 1 | — | — | 2 | — | — | — | — | — |
| Component (c) | | | | | | | | | | | |
| (c-2) | 2 | 2 | 2 | 1 | 3 | — | 3 | — | 1 | — | 2 |
| (c-1) | — | — | — | — | — | 2 | — | — | — | 2 | — |
| Binder | | | | | | | | | | | |
| Chlorinated Polyethylene | 45 | 45 | 45 | 45 | 45 | 45 | 45 | 45 | 45 | 45 | 45 |

TABLE 2-continued
| Examples 1-26 and Comparisons 1-24* | | | | | | | | | | |
|---|---|---|---|---|---|---|---|---|---|---|
| Sensitivity (step)(**) | 10 | 11 | 13 | 14 | 13 | 11 | 13 | 12 | 13 | 11 | 13 |
*Amounts are percentages by weight.
"—" indicates not present.
C = Comparison.
E = Example.
**Measured as in (2-1) above.
(Note)
Chemical structural formulae corresponding to the compound numbers of the photopolymerization initiator in TABLE 2 are as follows:
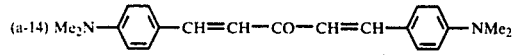
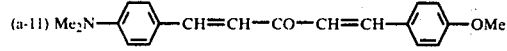
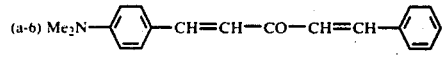
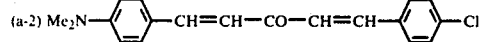
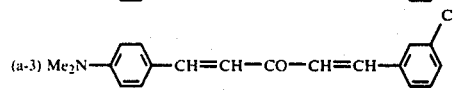
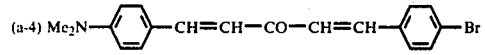
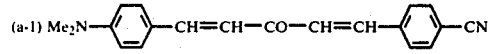
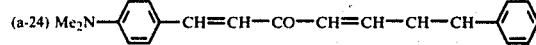
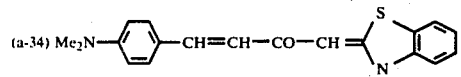
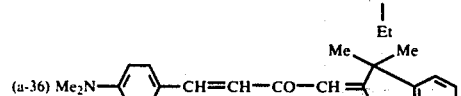
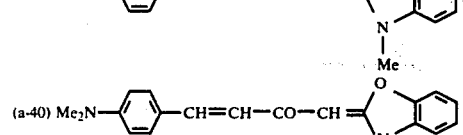
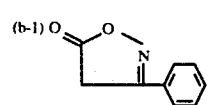
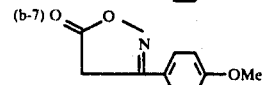
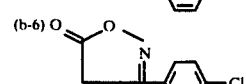
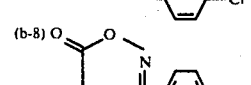
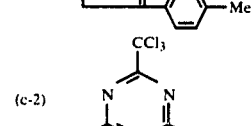
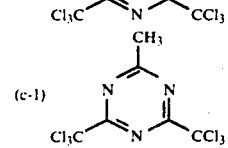

TABLE 3

Examples 27-38 and Comparisons 25-33*

| Example/Comparison No. | C25 | C26 | C27 | C28 | C29 | C30 | C31 | C32 | C33 | E27 | E28 |
|---|---|---|---|---|---|---|---|---|---|---|---|
| Ethylenic Compound | | | | | | | | | | | |
| Pentaerythritol Trimethacrylate | 50 | 50 | 50 | 50 | 50 | 50 | 50 | 50 | 50 | 50 | 50 |
| Photopolymerization Initiator | | | | | | | | | | | |
| Component (a) | | | | | | | | | | | |
| (a-11) | 5 | — | — | — | — | — | — | — | — | 1 | — |
| (a-3) | — | 5 | — | — | — | — | — | 2 | 2 | — | 1 |
| (a-24) | — | — | 5 | — | — | — | — | — | — | — | — |
| (a-34) | — | — | — | 5 | — | — | — | — | — | — | — |
| (a-36) | — | — | — | — | 5 | — | — | — | — | — | — |
| Component (b) | | | | | | | | | | | |
| (b-1) | — | — | — | — | — | 5 | — | 3 | — | 2 | 2 |
| (b-7) | — | — | — | — | — | — | — | — | — | — | — |
| Component (c) | | | | | | | | | | | |
| (c-2) | — | — | — | — | — | — | 5 | — | 3 | 2 | 2 |
| (c-1) | — | — | — | — | — | — | — | — | — | — | — |
| Binder | | | | | | | | | | | |
| Chlorinated Polyethylene | 45 | 45 | 45 | 45 | 45 | 45 | 45 | 45 | 45 | 45 | 45 |
| Sensitivity** (scan exposure amount of argon laser mW; diameter of beam: 100 μm) | 500 | 500 | 500 | 500 | 500 | more than 500 | more than 500 | 100 | 100 | 30 | 10 |

| Example/Comparison No. | E29 | E30 | E31 | E32 | E33 | E34 | E35 | E36 | E37 | E38 |
|---|---|---|---|---|---|---|---|---|---|---|
| Ethylenic Compound | | | | | | | | | | |
| Pentaerythritol Trimethacrylate | 50 | 50 | 50 | 50 | 50 | 50 | 50 | 50 | 50 | 50 |
| Photopolymerization Initiator | | | | | | | | | | |
| Component (a) | | | | | | | | | | |
| (a-11) | — | — | — | — | — | — | — | — | — | — |
| (a-3) | — | — | — | 1 | 1 | — | — | — | 2 | 2 |
| (a-24) | 1 | — | — | — | — | 1 | — | — | — | — |
| (a-34) | — | 1 | — | — | — | — | 1 | — | — | — |
| (a-36) | — | — | 1 | — | — | — | — | 1 | — | — |
| Component (b) | | | | | | | | | | |
| (b-1) | 2 | 2 | 2 | — | 2 | — | — | — | 1 | 2 |
| (b-7) | — | — | — | 2 | — | 2 | — | 2 | — | — |
| Component (c) | | | | | | | | | | |
| (c-2) | 2 | 2 | 2 | 2 | — | 2 | — | — | 2 | 1 |
| (c-1) | — | — | — | — | 2 | — | 2 | 2 | — | — |
| Binder | | | | | | | | | | |
| Chlorinated Polyethylene | 45 | 45 | 45 | 45 | 45 | 45 | 45 | 45 | 45 | 45 |
| Sensitivity** (scan exposure amount of argon laser mW; diameter of | 30 | 30 | 30 | 10 | 50 | 30 | 50 | 50 | 30 | 30 |

TABLE 3-continued

Examples 27-38 and Comparisons 25-33* beam: 100 μm)

*Amounts are percent by weight. "—" indicates not present.
E = Example. C = Comparison.
**Measured as in (2-2) above.
(Note)
Chemical structural formulae corresponding to the compound numbers of the photopolymerization initiator in Table 3 are as follows:

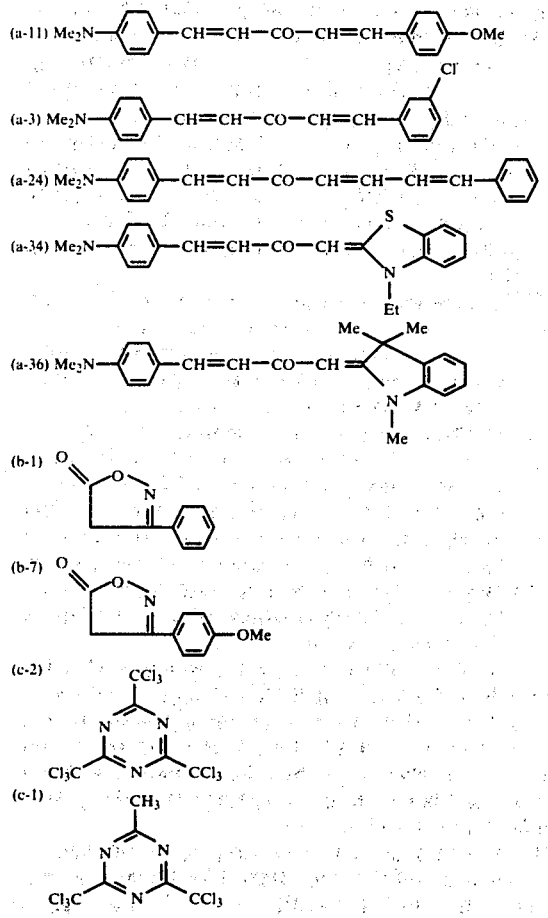

It is obvious from the results shown in Tables 2 and 3 that the photopolymerizable compositions of the present invention have high sensitivity necessary to form images by both of the super high pressure mercury lamps and the argon laser rays, as compared with the comparisons.

Further, in case of sensitive materials using the photopolymerizable compositions containing chlorinated polyethylene as the binder shown in the Examples, when a polyethylene terephthalate film was highly pressed against the photosensitive layer at production of the sensitive materials to make laminated products, images were formed on the aluminium plate by stripping the polyethylene terephthalate film after imagewise exposing in an exposure amount or scan exposure amount capable of forming the images, by which the photosensitive layer of the non-exposed areas was removed together with the polyethylene terephthalate film to leave the polymerized hardened photosensitive layer of the exposed areas on the aluminium plate.

While the invention has been described in detail and with reference to specific embodiments thereof, it will be apparent to one skilled in the art that various changes and modifications can be made therein without departing from the spirit and scope thereof.

What is claimed is:

1. In a photopolymerizable composition comprising (1) an addition-polymerizable compound having at least one ethylenically unsaturated double bond and (2) a photopolymerization initiator as essential components, the improvement which comprises that said photopolymerization initiator is a combination of (a) p-dialkylamino aromatic carbonyl compounds represented by the general formulae (1) to (4), (b) 5-isoxazolones represented by the general formula (5) and (c) 2,4,6-substituted-1,3,5-triazines represented by the general formula (6):

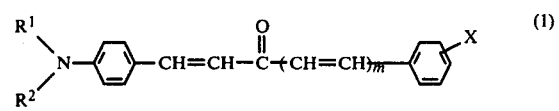

-continued

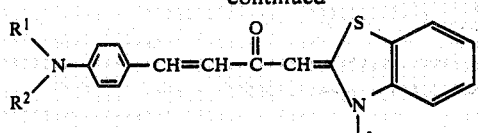

(2)

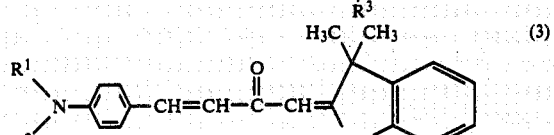

(3)

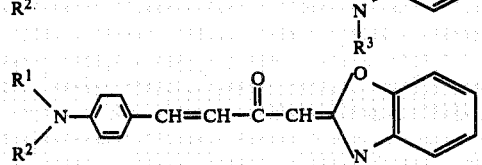

(4)

$$\begin{matrix} O= C & O-N \\ | & | \\ A^2-C & C-A^1 \\ | \\ H \end{matrix}$$ (5)

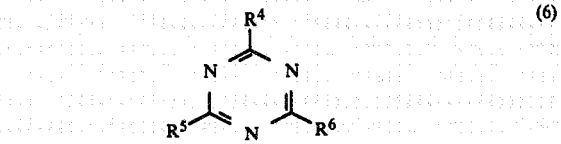

(6)

where R¹, R² and R³ each represents an alkyl grop or a substituted alkyl group, which may be the same or different from one another, X represents a substituent having a Hammett's σ value in the range from −0.9 to 0.7, m represents 1 or 2, A¹ and A² each represents an alkyl group, a substituted alkyl group, an alkylcarbonyl group, an alkoxycarbonyl group, an aryl group, a substituted aryl group, an arylcarbonyl group or a hydrogen atom, which may be the same or different from each other, and R⁴, R⁵ and R⁶ each represents an alkyl group, a substituted alkyl group, an aryl group, a substituted aryl group or an aralkyl group, which may be the same or different from each other, but at least one of R₄, R₅ and R₆ represents a mono-, di- or trihalomethyl group.

2. The photopolymerizable composition of claim 1 additionally comprising an organic high molecular material having film-forming ability and compatibility with components (1) and (2) as a binder.

3. The photopolymerizable composition of claims 1 or 2, wherein R¹, R² and R³ represent an alkyl group having 1 to 18 carbon atoms which may be substituted by a halogen atom or a hydroxyl group.

4. The photopolymerizable composition of claims 1 or 2, wherein X represents a substituent selected from the group consisting of a hydrogen atom, a methyl group, an ethyl group, an isopropyl group, a tert-butyl group, a phenyl group, a trifluoromethyl group, a cyano group, an acetyl group, an ethoxycarbonyl group, a carboxyl group, a carboxylato group (—COO⁻), an amino group, a methylamino group, a dimethylamino group, an ethylamino group, a diethylamino group, an acetylamino group, —PO₃H, a methoxy group, an ethoxy group, a propoxy group, an isopropoxy group, a butoxy group, a pentyloxy group, a phenoxy group, a hydroxyl group, an acetoxy group, a methylthio group, an ethylthio group, an isopropylthio group, a mercapto group, an acetylthio group, a thiocyano group (—SCN), a methylsulfinyl group, an ethylsulfinyl group, a methylsulfonyl group, an ethylsulfonyl group, an aminosulfonyl group, a dimethylsulfonyl group (—S⁺(CH₃)₂), a sulfonato group (—SO₃⁻), a fluorine atom, a chlorine atom, a bromine atom, an iodine atom, an iodyl group, a trimethylsilyl group (—Si(CH₃)₃), a triethylsilyl group and a trimethylstannyl group (—Sn(CH₃)₃).

5. The photopolymerizable composition of claim 4, wherein X represents a hydrogen atom, a methyl group, an ethyl group, a methoxy group, an ethoxy group, a dimethylamino group, a diethylamino group, a chlorine atom, a bromine atom or a cyano group.

6. The photopolymerizable composition of claims 1 or 2, wherein A¹ and A² represent an alkyl group having 1 to 5 carbon atoms which may be substituted with a halogen atom or a hydroxyl group, an alkylcarbonyl group having 2 to 6 carbon atoms, an alkoxycarbonyl group having 2 to 6 carbon atoms, or an aryl group which may be substituted by a halogen atom, an alkyl group having 1 to 5 carbon atoms, or an alkoxy group having 1 to 5 carbon atoms.

7. The photopolymerizable composition of claims 1 or 2, wherein R⁴, R⁵ and R⁶ represent an alkyl group having 1 to 18 carbon atoms which may be substituted by a halogen atom or a hydroxyl group, an aryl group which may be substituted by a halogen atom, an alkyl group or an alkoxy group, or a phenyl or naphthyl-substituted C₁ to C₁₀ alkyl group.

8. The photopolymerizable composition of claims 1 or 2, wherein said photopolymerization initiator is present in an mount of about 0.01 to about 20% by weight based on the weight of the addition-polymerizable compound (1).

9. The photopolymerizable composition of claims 1 or 2, wherein the ratio of said component (a) to said component (b) and the ratio of said component (a) to said component (c) is about 30:1 to about 1:30.

10. The photopolymerizable composition of claim 2, wherein said binder renders the composition developable by stripping, water, or an aqueous alkaline solution.

* * * * *